United States Patent [19]
Kliman

[11] Patent Number: 5,049,815
[45] Date of Patent: Sep. 17, 1991

[54] SPECTRAL ANALYSIS OF INDUCTION MOTOR CURRENT TO DETECT ROTOR FAULTS WITH REDUCED FALSE ALARMS

[75] Inventor: Gerald B. Kliman, Schenectady, N.Y.

[73] Assignee: General Electric Company, Schenectady, N.Y.

[21] Appl. No.: 572,578

[22] Filed: Aug. 27, 1990

Related U.S. Application Data

[63] Continuation-in-part of Ser. No. 512,223, Apr. 20, 1990, abandoned.

[51] Int. Cl.⁵ ............... G01R 31/02; G01R 23/16
[52] U.S. Cl. ................... 324/158 MG; 324/77 B; 324/545
[58] Field of Search ............. 324/158 MG, 545, 546, 324/77 B; 340/648; 361/5, 20, 31; 322/99; 364/485

[56] References Cited

U.S. PATENT DOCUMENTS

| | | | |
|---|---|---|---|
| 2,640,100 | 5/1953 | Packer et al. | 324/158 MG |
| 4,156,846 | 5/1979 | Harrold et al. | 324/158 MG |
| 4,377,784 | 3/1983 | Saito et al. | 324/158 MG |
| 4,678,990 | 7/1987 | Bicknell et al. | 324/158 MG |
| 4,761,703 | 8/1988 | Kliman et al. | 361/23 |
| 4,808,932 | 2/1989 | Schulz, Jr. et al. | 324/545 |
| 4,853,818 | 8/1989 | Emery et al. | 324/546 |
| 4,978,909 | 12/1990 | Hendrix et al. | 324/158 MG |

*Primary Examiner*—Ernest F. Karlsen
*Attorney, Agent, or Firm*—Henry J. Policinski; Robert A. Cahill

[57] ABSTRACT

Pursuant to detecting rotor faults in an induction motor by analysis of a frequency spectrum of the current drawn by the motor under test, wherein success of the fault analysis requires an accurate determination of the fundamental frequency of the motor current and the motor slip frequency, method and apparatus are disclosed for determining the fundamental and slip frequency values solely from analysis of the motor current spectra.

17 Claims, 3 Drawing Sheets

SPECTRAL ANALYSIS OF INDUCTION MOTOR CURRENT TO DETECT ROTOR FAULTS WITH REDUCED FALSE ALARMS

This application is a continuation-in-part of Ser. No. 07/512223, filed Apr. 20, 1990, now abandoned.

The present invention relates to the inspection of electrical motors and particularly to the detection of rotor faults in induction motors.

BACKGROUND OF THE INVENTION

Both utility and industrial users of induction motors have historically been concerned in finding reliable procedures for detecting rotor faults or "cage faults" before such faults become exacerbated to the point of catastrophic motor failure Obviously, such motor failures can force expensive shutdowns of factory production and in certain applications can have adverse safety implications.

Until recently, the detection of rotor faults involved taking the induction motor out of service, disassembly and/or the application of special instrumentation internally and/or externally to the motor For example, U.S. Pat. No. 4,808,932 discloses a broken rotor bar detector which requires the installation of a flux coil wound on one of the stator teeth of an induction motor. Implementation of such a detector requires motor disassembly, unless the flux coil is installed at the time of manufacture or rewinding. U.S. Pat. No. 4,761,703 discloses a rotor fault detector based on motor current analysis which requires the stationing of a flux coil at an appropriate external position proximate the motor to pick up stray axial flux in order to precisely determine motor speed. This approach does not require motor disassembly, or, in many cases, an interruption in service. However, in some motor applications it is not convenient from the standpoint of accessibility or there is no space available to station the flux coil in an appropriate external flux detection position.

It is accordingly an object of the present invention to provide a method and apparatus for detecting rotor faults in induction motor which is totally non-invasive of the motor operating environment.

A further object is to provide a rotor fault detection method and apparatus of the above-character which does not require motor disassembly or even service interruption.

An additional object is to provide a rotor fault detection method and apparatus of the above-character, which relies solely on an analysis of motor current which can be sensed at a point removed from the motor operating environment, such as at its motor control center Another object is to provide a rotor fault detection method and apparatus of the above-character, which avoids false indications of rotor faults Yet another object is to provide a rotor fault detection method and apparatus of the above-character, which is capable of reliably providing an early indication of rotor faults, thus enabling the user to schedule convenient service and repair well in advance of any catastrophic failure.

Other objects of the invention will in part be obvious and in part appear hereinafter.

SUMMARY OF THE INVENTION

In accordance with the present invention, there is provided an improved method and apparatus for detecting incipient rotor faults in induction motors which relies solely on passive monitoring and analysis of the motor current. Signals indicative of the current drawn by the motor are digitized, stored, and digitally processed using a Fast Fourier Transform (FFT) to generate a frequency spectrum of the motor current. As is now known in the art, rotor faults, especially broken rotor bars, are manifested by exaggerated current peaks in sidebands of the fundamental motor current and certain harmonics thereof at frequencies determined by the slip frequency of the motor. Thus, from this current spectrum, the fundamental motor current frequency is identified and, based on an estimation of the motor slip frequency (typically obtained from the motor nameplate data), a search is conducted for current peaks in excess of an established threshold in a sideband of the fundamental frequency over a search range predicated on the slip frequency estimate. If no current peaks are found, the rotor is declared to be fault-free.

However, if current peaks are noted in the fundamental frequency sideband, the frequency of each is declared a slip frequency candidate, and checks are conducted in appropriate harmonic sidebands at frequencies predicted on the basis of each slip frequency candidate for matching current peaks. As long as matching current peaks are noted, the slip frequency candidates remain qualified. The search is extended to higher harmonic sidebands until all but one of the slip frequency candidates are disqualified. The one remaining candidate is then declared the slip frequency of the motor and is utilized in a rotor fault analysis of the motor current spectrum to determine the nature and severity of the fault.

For a full understanding of the nature and objects of the present invention, reference may be had to the following Detailed Description taken in conjunction with the accompanying drawings, in which.

DETAILED DESCRIPTION OF THE INVENTION

Figure 1:
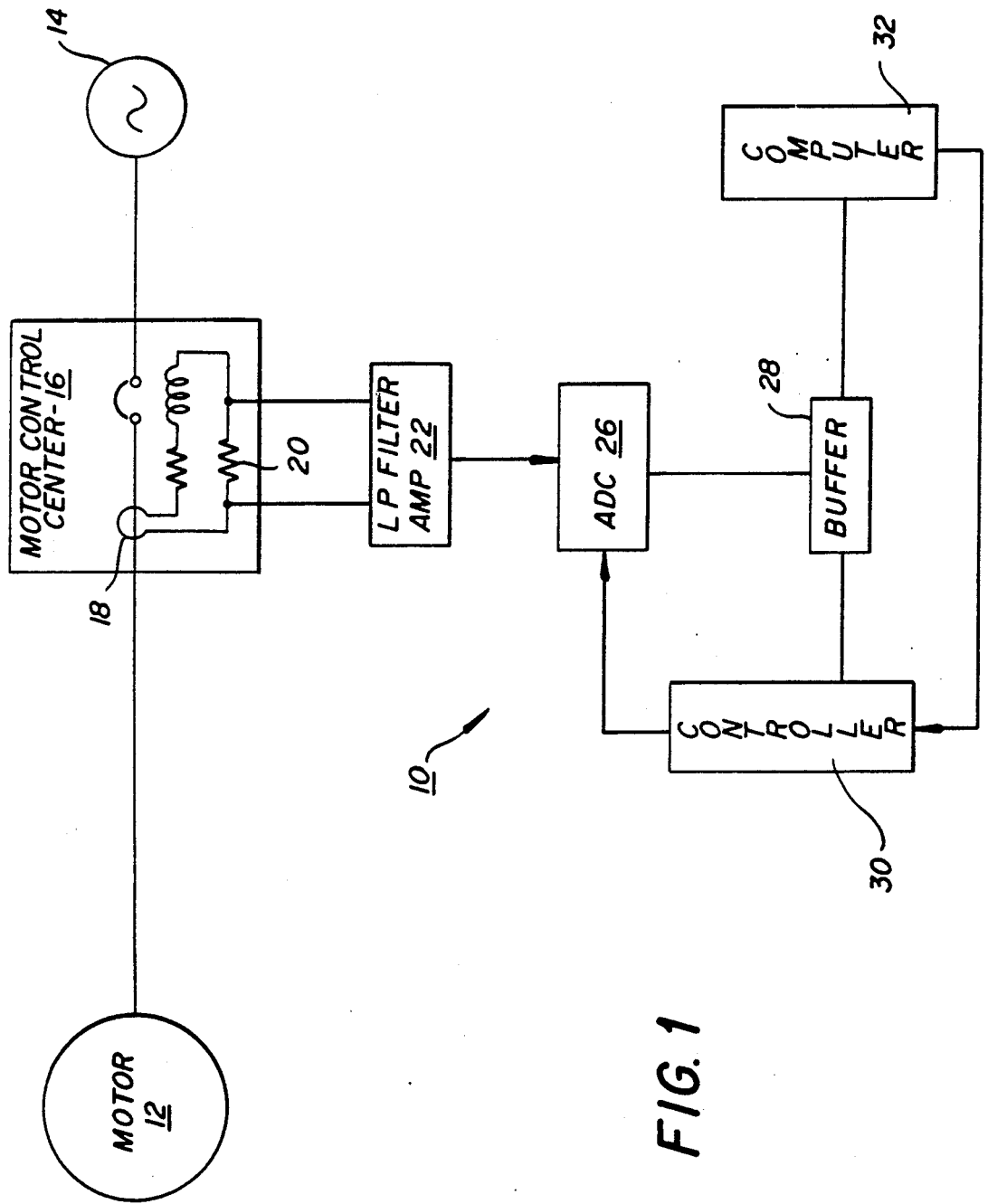
FIG. 1 is a circuit block diagram illustrating rotor fault detection apparatus constructed in accordance with the present invention.

The detection apparatus of the present invention, generally indicated at 10 in FIG. 1, is illustrated in its application to detect rotor faults in an induction motor 12. The motor draws current from an AC source 14, for example a standard three-phase source of standard line frequency, e.g. 60 Hz, through a typical motor control center 16. As is conventional, the motor control center is equipped with an instrument transformer 18 linked with one phase line to monitor the 60 Hz current for control and instrumentation purposes. Installed in the instrumentation transformer secondary circuit is a small precision resistor 20 across which signals indicative of one of the phase currents drawn by the motor are tapped for application to detector 10. It will be appreciated that motor current may be monitored by a separate split core current transformer clipped on one phase line at any point in the feed circuit for motor 12.

Still referring to FIG. 1, the motor current signal tapped from resistor 20 is fed to a low pass filter/amplifier 22, such that signal content above a predetermined cutoff frequency is eliminated. This cutoff frequency is set at a value somewhat greater than the highest spectral point to be utilized in the analysis of the current signal in accordance with the present invention. Thus, for 60 Hz motor current, the cutoff frequency should be set at approximately 800 Hz, which is somewhat higher that the thirteenth harmonic, 780 Hz, of the line frequency.

The amplified and low-pass-filtered current signal is sampled and converted to a series of digital values by an analog-to-digital converter (ADC) 26, which are stored in a buffer 28. The signal sampling and digitizing rate, as well as the buffering of the digitized signal, are controlled and coordinated by a controller 30 under the programmed control of a computer 32 into which the digitized signal is loaded. This data collection procedure is carried out at a suitable collection rate of, for example, 2000 samples per second over an appropriate period of about twenty seconds, which provides sufficient data upon which the computer can generate a comprehensive frequency spectrum of the motor current suitable for accurate analysis using, for example, commercially available Fast Fourier Transform (FFT) software.

The above-described data collection operation is basically that described in the above-cited U.S. Pat. No. 4,761,703, one of the paentees therein being the applicant herein. The disclosure of this patent is specifically incorporated in this application by reference. The major exception is that data is collected solely on the motor current in accordance with the present invention. In the invention of this patent, data is collected on both the motor current and the motor axial flux, hence the need for a flux coil to detect this stray flux. Thus, the present invention requires less hardware and data storage capacity, and data processing time is reduced.

As explained in this U.S. Pat. No. 4,761,703, open or high resistance bars in the rotor of an induction motor either interrupt or diminish the currents induced therein by the stator magnetic field generated by the motor current. These rotor fault conditions perturb the air gap flux, and, in turn, cause pertubations of the motor current not found in the case of sound rotors. More specifically, when rotor faults exist, signal peaks should appear in the motor current at certain frequencies:

$$f_k = f_o[k/p(1-s) \pm s]$$   Eq. 1 where $f_o$ = fundamental line frequency (usually 60 Hz)
$k$ = harmonic index (1, 2, 3, ....)
$p$ = motor pole-pairs
$s$ = per unit slip of motor or slip frequency/$f_o$ The motor slip frequency ($f_s$) at 60 Hz is calculated as follows:

$$f_s = f_o - motor\ RPM \cdot p/60$$

While pertubations at all of the frequencies $f_k$ should be present in the air gap flux, due to the structure of the stator windings in an induction motor, only pertubations at those frequencies where $k/p = 1, 5, 7, 11, 13..$ (i.e., where $k/p$ = an odd number, excluding multiples of 3) will appear in the motor current. Moreover, the existence of rotor faults, especially broken bars, has effects on the magnitudes of the motor current components at these certain frequency components which are distinguishable from the effects noted with a fault-free rotor.

From Equation 1, it is seen that each frequency component $f_k$ is a pair of sideband frequencies, $\pm sf_o$, surrounding each harmonic of the frequency $k/p \cdot f_o(1-s)$, which can be expressed as:

$$LSB_n = nf_o(1-s) - sf_o$$

$$USB_n = nf_o(1-s) + sf_o$$

where $n = k/p = 1, 5, 7, 11, 13$
$LSB_n$ = lower sideband frequency at harmonic index n
$USB_n$ = upper sideband frequency at harmonic index n It will be noted that the upper sideband USB for harmonic index n=1 is equal to the line frequency $f_o$. Since the fundamental or first harmonic of the motor current is dominated by source 14, upper sideband $USB_1$ is not useful for detecting rotor faults. Thus the frequency components of interest are as follows:

$LSB_1 = f_o(1-2s)$
$USB_5 = f_o(5-4s)$
$LSB_5 = f_o(5-6s)$
$USB_7 = f_o(7-6s)$
$LSB_7 = f_o(7-8s)$
$USB_{11} = f_o(11-10s)$
$LSB_{11} = f_o(11-12s)$
$USB_{13} = f_o(13-12s)$
$LSB_{13} = f_o(13-14s)$

It will be appreciated that the per unit slip may be as small as 0.0032, and thus high resolution spectrum analysis is required to accurately resolve the amplitudes of the motor current components at each of the sideband frequencies indicated above.

Figure 2:
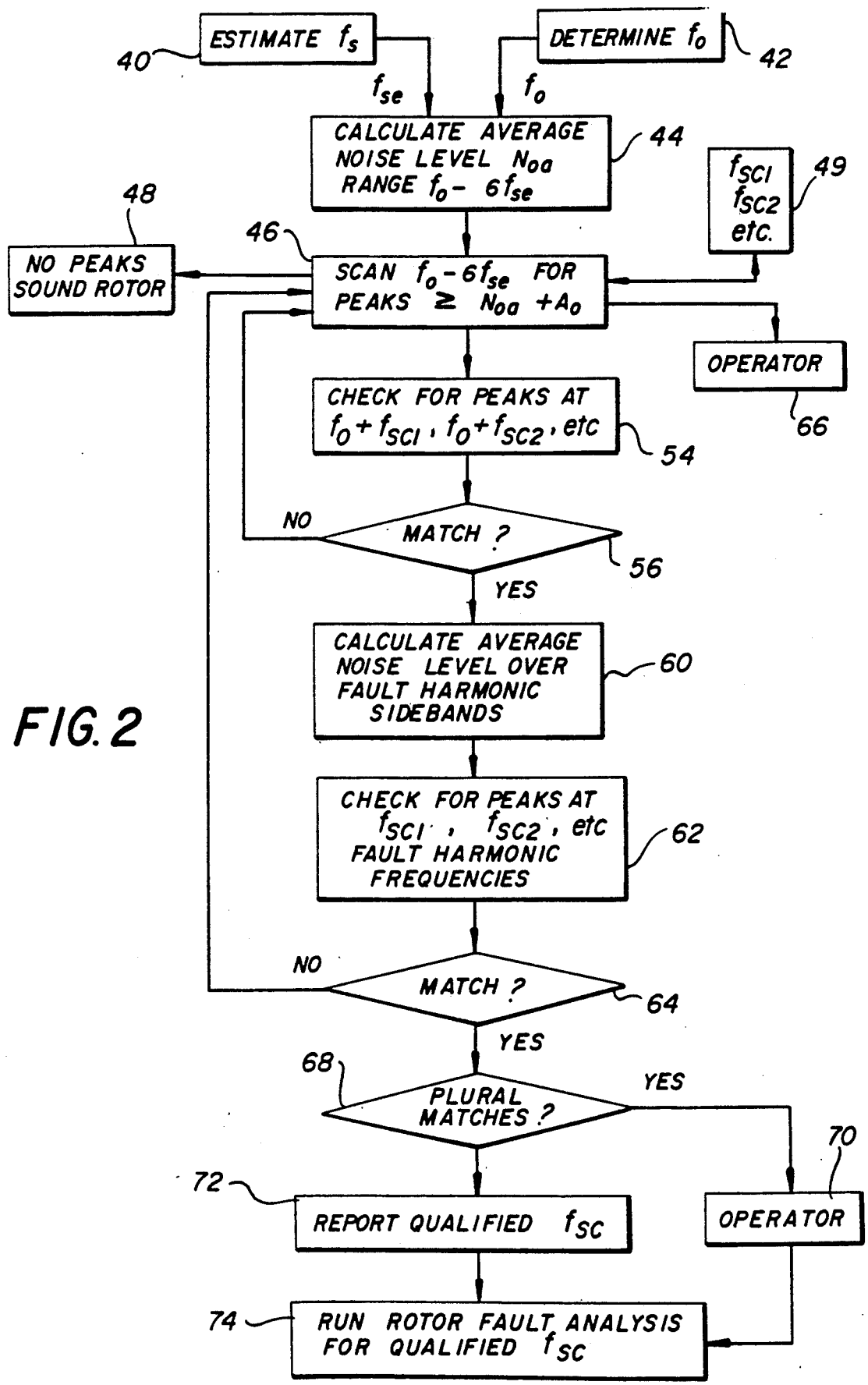
FIG. 2 is a flow chart illustrating the method for detecting rotor faults in accordance with the present invention utilizing the apparatus of FIG. 1.

Having collected all the data samples of the motor current over the desired sample period and transformed the data to frequency spectra using high resolution (e.g. 0.03 Hz bin size) Fast Fourier Transform, the frequency spectrum is analyzed in accordance with the flow chart of FIG. 2. One initial step, indicated by block 40, is to enter an estimation of the slip frequency $f_s$. Since, in accordance with the present invention, there is no collection of axial flux data from which an accurate determination of slip frequency can be made, as in the referenced U.S. Pat. 4,761,703, slip frequency must be estimated. For purposes of the present invention, an acceptable estimate of slip frequency can be made from the motor's nameplate data and the particular load being driven. This slip frequency estimate $f_{se}$ is entered in computer 32. Alternatively, the motor nameplate data and load characteristics are entered, and the computer calculates an estimated slip frequency $f_{se}$.

Figure 3:
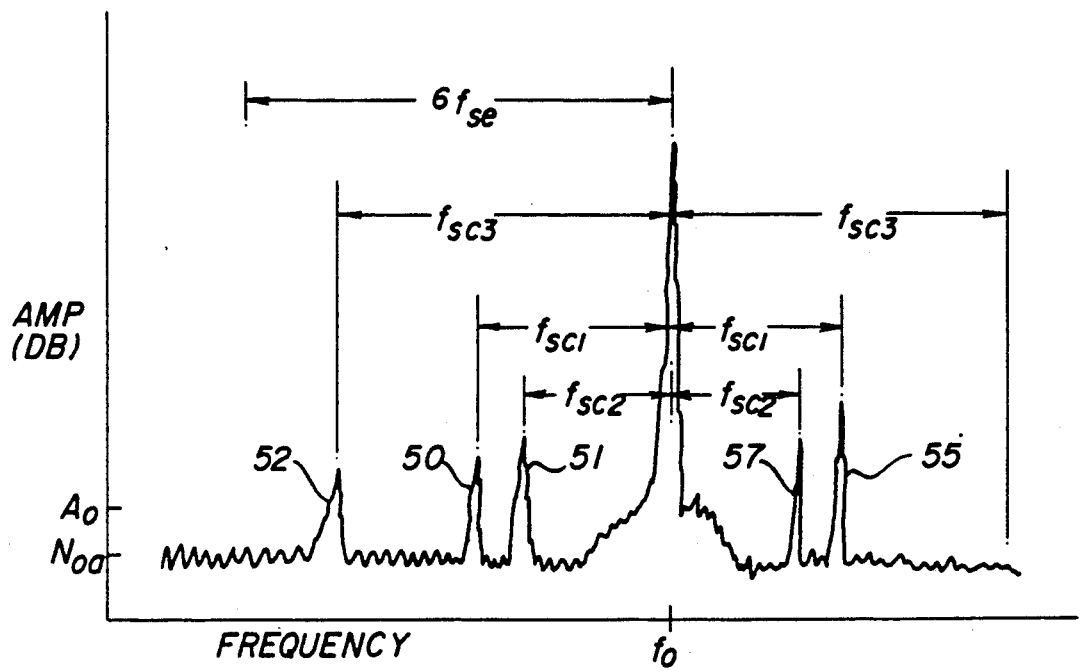
FIGS. 3 and 4 are current spectra diagrams of sidebands of the first (fundamental) and fifth harmonics, respectively, of the motor current.

A second initial step is to determine the fundamental motor current frequency as indicated by block 42. This is preferably achieved by analyzing the current spectrum using a quadratic interpolation routine as disclosed in FIG. 3 of referenced U.S. Pat. No. 4,761,703. The determined fundamental or line frequency $f_o$ and estimated slip frequency $f_{se}$ are applied to block 44 of FIG. 2 where a calculation is made of the average noise level $N_{oa}$ over a suitable search range of frequencies in the frequency spectra of the lower sideband of the fundamental frequency, such as $f_o - 6f_{se}$. Referring to an exemplary motor current spectra surrounding the fundamental frequency seen in FIG. 3, this search range is indicated by $6f_{se}$. The average noise level $N_{oa}$ indicated in FIG. 3 is calculated by standard methods wherein the signal levels, exclusive of any prominent signal peaks, are averaged over the search range. Alternatively, the search range is first scanned for prominent signal peaks, and average noise levels are calculated for signals in a localized band surrounding each peak. Thus, a unique average noise level is calculated for each peak.

Having determined average noise level $N_{oa}$ in search range $f_o - 6f_{se}$, the next step, block 46, is to scan this search range for prominent signal peaks of amplitudes exceeding the average noise level $N_{oa}$ over the search range or their unique average noise levels by a predetermined fault threshold value A, i.e., peaks $\therefore N_{oa} + A_o$. If no signal peaks meeting this criteria are found, the rotor is declared free of fault, i.e., no broken rotor bars, as indicated by block 48.

However, if prominent signal peaks meeting this fault threshold criteria are found, their frequency positions in the spectrum are declared as slip frequency candidates for application in the rotor fault equation Eq. 1 set forth above. In the portion of the frequency spectrum surrounding the fundamental frequency $f_o$ (e.g. 60 Hz), illustrated in FIG. 3, prominent signal peaks 50, 51 and 52 at frequencies $f_{sc1}$, $f_{scs2}$ and $f_{sc3}$, respectively, were found and thus declared (block 49) as slip frequency candidates having frequencies at twice the slip frequency, $2f_s$, (Eq. 1).

Applicant has discovered that, due primarily to speed oscillations, there will usually be a prominent signal peak, $\geq N_{oa} + A_o$, at twice slip frequency, $2f_s$, above the fundamental frequency. The next step in accordance with the invention, as indicated by block 54, is then to look for signal peaks meeting this criteria at frequencies symmetrical with the frequencies of signal peaks 50–52 about the fundamental frequency $f_o$. Thus, taking signal peak 50 at frequency $f_o - f_{sc1}$, the sideband above the fundamental frequency is inspected at frequency $f_o + f_{sc1}$ for a prominent signal peak. In the spectrum illustration of FIG. 3, signal peak 55 is found at this frequency $f_o + f_{sc1}$, decision block 56. Next, the upper sideband frequency $f_o + f_{sc2}$ is checked to see if a signal peak symmetrical with lower sideband peak 51 exists. In the illustration of FIG. 3, signal peak 57 is found. This routine is repeated for a signal peak at $f_o + f_{sc3}$, and none is found. Thus, the frequency $f_{sc3}$ of signal peak 52 is dropped as a slip frequency candidate, leaving candidates $f_{sc1}$ (signal peak 50) and $f_{sc2}$ (signal peak 51) qualified for continued analysis.

Figure 4:
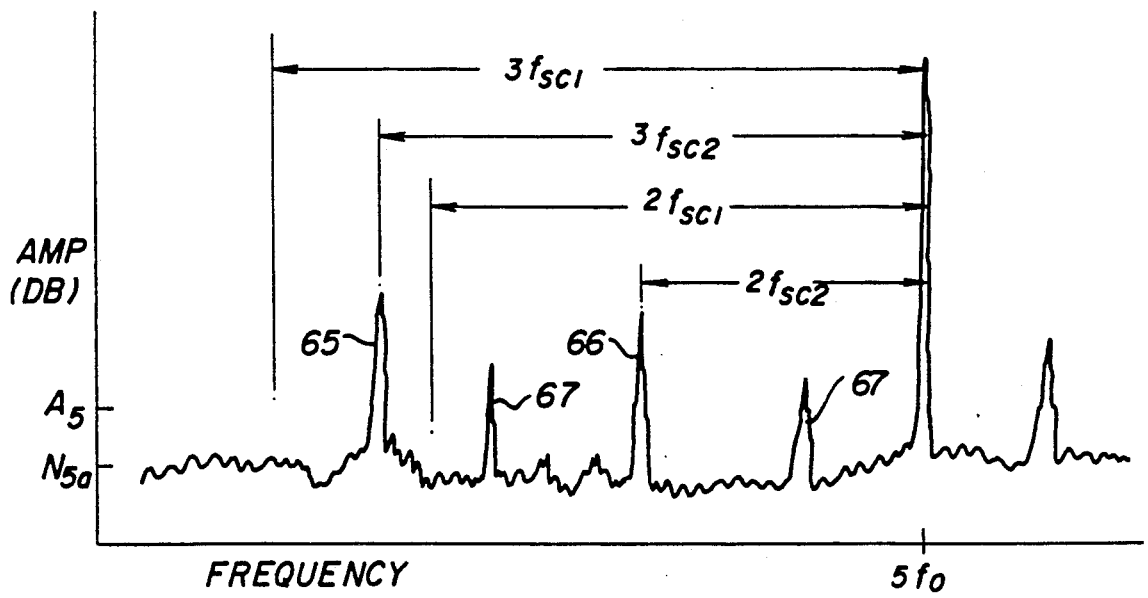

The next step is to check each of these qualified candidates for matching signal peaks in the lower sideband of their fifth harmonic, the spectrum of which is illustrated in FIG. 4. First however, as indicated by block 60, the average noise level $N_{5a}$ over a suitable range in the lower sideband of the fifth harmonic $5f_o$ of the fundamental frequency sufficient to include the harmonic fault frequencies of the remaining slip frequency candidates must be calculated. As seen from Eq. 1 above, this range must encompass the upper and lower fifth harmonic sideband fault frequencies for each of the slip frequency candidates $f_{sc1}$ and $f_{sc2}$, i.e., $5f_o - 2f_{sc1}$, $5f_o - 3f_{sc1}$, $5f_o - 2f_{sc2}$, and $5f_o - 3f_{sc2}$, recalling that the fundamental or first harmonic fault frequencies of the candidates would be twice slip frequency. Thus, as indicated in the block 62, the frequencies $3f_{sc1}$ and $2f_{sc1}$ below the fifth harmonic fault threshold) to match signal peak 50 in signal peaks of amplitudes $\therefore N_{a5} + A_5$ (as appropriate fifth harmonic fault threshold) to match signal peak 50 in FIG. 3. As seen in FIG. 4, no signal peaks are found at frequencies $5f_o - 2f_{sc1}$ and $5f_o - 3f_{sc1}$, and thus $f_{sc1}$ can be rejected as a slip frequency candidate, per decision block 64. However, upon checking for signal peaks $\therefore N_{a5} + A_5$ in the fifth harmonic lower sideband matching signal peak 51, it is seen that signal peak 65 at frequency $5f_o - 3f_{sc2}$ and signal peak 66 at frequency $5f_o - 2f_{sc2}$ qualify. Note that signal peaks 67 in FIG. 4 are ignored even through their amplitudes satisfy the $\therefore N_{a5} + A_5$ criteria.

Preferably, before declaring frequency $f_{sc2}$ as a successful determination of the true slip frequency, the rotor fault sideband below the seventh harmonic is investigated for signal peaks matching the fundamental fault signal peak 51. For greater confidence, the eleventh and thirteenth harmonics could also be investigated, however there is the risk of rejecting the true slip frequency candidate due to the low signal-to-noise ratios at these higher harmonics. In most cases, limiting the investigation to the fifth and seventh harmonics is adequate for accurately determining slip frequency.

Decision blocks 56 and 64 indicate that slip frequency candidates $f_{sc1}$, $f_{sc2}$, etc., are checked for matching signal peaks in iterative fashion. Thus, the investigation proceeds through the harmonic fault sidebands with regard to one candidate until it is disqualified, whereupon the program returns to block 46 to begin the investigation of the next candidate. If all candidates are disqualified, an operator is alerted, as indicated by block 66, to obtain a printout of or to display the motor current spectrum for visual analysis. The operator may decide that a new set of data should be collected for slip frequency determination.

Decision block 68 checks to see if there is more than one qualified slip frequency candidate. If yes, the operator is alerted, block 70, to visually analyze the motor current spectrum. If there is found to be a single qualified slip frequency candidate, it is reported to a rotor fault analysis program (blocks 74 and 76) for utilization as the true slip frequency in the final analysis of the motor current spectrum for rotor faults. In case two slip frequency candidates are qualified, the operator may elect to report both to the rotor fault analysis program 76, and a motor current spectrum analysis would be run on the basis of each candidate.

It will be appreciated that checking for current peaks at predicted frequencies in the appropriate harmonic fault sidebands matching those current peaks found in the fundamental frequency sideband, not only provides for precise determination of slip frequency by process of elimination, but also avoids false rotor fault indications which could result from analysis of the motor current spectrum. Since normal mechanical oscillations in the motor load will frequently cause spectral current peaks to show up in the vicinity of the line frequency, it is obviously essential that these current peaks not be interpreted as broken rotor bar indications. In addition, mechanical oscillations or broken rotor bars of another motor on the same or a closely connected bus may also cause current peaks which are obviously irrelevant to the motor under test. By virtue of the present invention, these spurious current peaks are eliminated before the rotor fault analysis program step is reached and therefore can not give rise to false alarms, i.e., false broken rotor bar indications.

It is understood that, in checking each slip frequency candidate for signal peaks at the predicted frequencies in the harmonic fault sidebands, a certain amount of leeway is allowed, e.g. ± three FFT bins, in which a signal peak must appear to be considered as matching the signal peak of the slip frequency candidate in the fundamental frequency lower sideband.

Rotor fault analysis may be conducted in the manner disclosed in the referenced patent U.S. Pat. No. 4,761,703, except herein, only the motor current spectrum is analyzed since there is no collection of associated axial flux data as in this patent. Thus the amplitude values of the current peaks at the various rotor fault harmonics are compared against corresponding fault criteria values or range of values determined from a motor current spectrum analysis previously obtained from the same motor under test when it was known to be sound, i.e., a "motor personality file". If a motor personality file is not available, then the fault analysis must use a standard personality file of the best available mean fault criteria values for motors of the same type, size and loading as the particular motor under test. On the basis of these comparisons, it is possible to determine with a high degree of certainty the character and severity of the rotor fault. Thus, rotor asymmetries can be distinguished from a rotor bar break and, in the latter case, whether the break is severe, i.e., plural broken rotor bars.

It is seen from the foregoing that the present invention provides method and apparatus for determining the slip frequency of an induction motor without having to monitor air gap or axial flux or measure motor speed. Rather, slip frequency, a requisite data input for detecting rotor faults, is determined solely from monitoring the current drawn by a motor and analyzing the frequency spectrum thereof. Consequently, implementation of the present invention does not require invasion of the motor operating environment or even interruption of service, as motor current monitoring can be accomplished at any convenient point between the motor and its power source.

While the present invention has been described with reference to specific embodiments, it is intended that matters of detail set forth above be taken as illustrative rather than in a limiting sense and that the full scope of the invention be as defined in the appended claims.

Having described the invention, what is claimed as new and desired to secure by Letters Patent is:

1. A method of detecting rotor faults in an induction motor, wherein the motor includes a rotor having a multiplicity of conductive bars and a stator drawing motor current from a power supply, the method comprising the steps of:
   A. deriving a current signal indicative of said motor current;
   B. sampling said current signal at a predetermined sampling rate to obtain a time succession of current values over a predetermined sampling period;
   C. transferring said current values to a frequency spectrum;
   D. determining the fundamental frequency of said motor current from said frequency spectrum;
   E. scanning said frequency spectrum in a lower sideband of said fundamental frequency for current peaks exceeding a threshold amplitude;
   F. ascribing the frequency of each said current peak as a candidate indicating the slip frequency of the motor;
   G. checking predetermined harmonic sidebands of said frequency spectrum at frequencies predicted from each said slip frequency candidate for matching current peaks until all but one of said slip frequency candidates are disqualified; and
   H. conducting a rotor fault analysis of said frequency spectrum using the determined fundamental frequency and the qualified remaining one of said slip frequency candidates as the motor slip frequency.

2. The method defined in claim 1, wherein the checked frequencies in said harmonic sidebands predicted from said slip frequency candidates include at least two of the frequencies $F_o(5-4s)$, $f_o(5-6s)$, $f_o(7-6s)$, $f_o(7-8s)$, $f_o(11-10s)$, $f_o(11-12s)$, $f_o(13-12s)$ and $f_o(13-14s)$, where $f_o$ is said fundamental frequency, and s is the frequency of each said slip frequency candidate divided by said fundamental frequency.

3. The method defined in claim 2, where said slip frequency candidates are disqualified when matching current peaks are not found at said predicted frequencies.

4. The method defined in claim 3, which further includes the steps of checking an upper sideband of said fundamental frequency for matching current peaks at frequencies symmetrically related with the lower sideband frequencies of said slip frequency candidates and disqualifying said slip frequency candidates when matching current peaks in said upper sideband are not found.

5. The method defined in claim 3, wherein, in the event no current peaks are found in said fundamental frequency lower sideband, the rotor is declared free of fault without conducting method steps F, G and H.

6. The method defined in claim 3, wherein said scanning step E is conducted over a range of frequencies based on an estimate of the motor slip frequency.

7. The method defined in claim 6, wherein said slip frequency estimate is obtained from the motor's nameplate data and the characteristics of the motor's loading.

8. The method defined in claim 6, which further includes the steps of checking an upper sideband of said fundamental frequency for matching current peaks at frequencies symmetrically related with the lower sideband frequencies of said slip frequency candidates and disqualifying said slip frequency candidates when matching current peaks in said upper sideband are not found.

9. The method defined in claim 8, wherein, in the event no current peaks are found in said fundamental frequency lower sideband, the rotor is declared free of fault without conducting method steps F, G and H.

10. Apparatus for detecting rotor faults in an induction motor having a rotor including a plurality of conductive bars and a stator drawing motor current from a power source, said apparatus including:
   A. a current sensor for deriving a current signal indicative of said motor current;
   B. sampling means for storing a time series of current values over a predetermined sampling period;
   C. transform means for generating a frequency spectrum of said current values;
   D. first means for determining the fundamental frequency of said motor current from said frequency spectrum of said current values;

E. second means for determining the slip frequency of the motor from said frequency spectrum of said current values; and F. third means for analyzing said frequency spectrum of said current values at certain fundamental and harmonic sideband frequencies determined from said fundamental and slip frequencies to identify the presence and severity of any rotor faults.

11. The apparatus defined in claim 10, wherein said second means scans a lower sideband of said fundamental frequency for current peaks exceeding a threshold amplitude; ascribes each said current peak as a candidate indicating the motor slip frequency, checks predetermined harmonic lower sidebands at certain frequencies predicted from each said slip frequency candidate for matching signal peaks until all but one of said slip frequency candidates are disqualified, and declares the one remaining slip frequency candidate the true indicator of motor slip frequency.

12. The apparatus defined in claim 11, wherein said second means checks for matching current peaks at least two of the predicted frequencies $f_o(5-4s)$, $f_o(5-6s)$, $f_o(7-6s)$, $f_o(7-8s)$, $f_o(11-10s)$, $f_o(11-12s)$, $f_o(13-12s)$ and $f_o(13-14s)$, where $f_o$ is the fundamental frequency and s is the frequency of each slip frequency candidate divided by the fundamental frequency.

13. The apparatus defined in claim 12, wherein said second means disqualifies said slip frequency candidates when matching current peaks are not found at said predicted frequencies.

14. The apparatus defined in claim 13, which further includes fourth means responsive to said second means for indicating no rotor faults when no current peaks are found in said lower sideband of said fundamental frequency.

15. A method for detecting rotor faults in an induction motor having a rotor including a plurality of conductive bars and a stator drawing motor current from a power supply, said method comprising the steps of:

A. deriving a current signal indicative of motor current;

B. sampling said current signal at a predetermined sampling rate to obtain a time succession of current values over a predetermined sampling period;

C. transforming said current values to a frequency spectrum;

D. determining the fundamental frequency of said motor current from said frequency spectrum of current values;

E. analyzing said frequency spectrum of current values to identify the true slip frequency of the motor; and F. conducting a rotor fault analysis of said frequency spectrum of current values using the fundamental frequency value determined in step D and the true slip frequency value identified in step E.

16. The method defined in claim 15, wherein said analyzing step E includes the steps of scanning a sideband of said fundamental frequency for signals indicative of motor slip frequency, and checking each of said signals at predicted frequencies in at least one predetermined harmonic sideband to identify which one of said signals is a true indicator of motor slip frequency.

17. The method defined in claim 16, which further includes the step of declaring the rotor free of fault upon the failure of step E to find slip frequency indicative signals in said fundamental frequency sideband.

* * * * *